(12) United States Patent
Rao (10) Patent No.: US 7,164,379 B1
(45) Date of Patent: Jan. 16, 2007

(54) PIPELINE ANALOG TO DIGITAL CONVERTER

(75) Inventor: Naresh Kesavan Rao, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/289,934

(22) Filed: Nov. 30, 2005

(51) Int. Cl.
*H03M 1/38* (2006.01)

(52) U.S. Cl. ...................... 341/161; 341/155
(58) Field of Classification Search ............ 341/161, 341/155, 166, 158, 159
See application file for complete search history.

(56) References Cited

U.S. PATENT DOCUMENTS

| | | | |
|---|---|---|---|
| 5,748,134 A | 5/1998 | Dent | 341/172 |
| 6,175,323 B1 | 1/2001 | Flynn | 341/156 |
| 6,278,395 B1 | 8/2001 | Ito et al. | 382/107 |
| 6,366,231 B1 | 4/2002 | Rao et al. | 341/166 |
| 6,369,742 B1 * | 4/2002 | Alexander et al. | 341/159 |
| 6,977,601 B1 * | 12/2005 | Fletcher et al. | 341/143 |
| 7,095,354 B1 * | 8/2006 | Harrison et al. | 341/159 |
| 2001/0048383 A1 | 12/2001 | Nagaraj | 341/159 |
| 2002/0093447 A1 | 7/2002 | Li | 341/58 |
| 2002/0196172 A1 | 12/2002 | Bult | 341/58 |
| 2004/0113678 A1 | 6/2004 | Welles, II et al. | 327/336 |

* cited by examiner

*Primary Examiner*—Peguy JeanPierre
(74) *Attorney, Agent, or Firm*—Jean K. Testa; Donald S. Ingraham (57) ABSTRACT

An analog to digital conversion circuit includes a first circuit (10) for receiving an analog signal (16) applied to an input (e.g., 26) of the first circuit via a connection to an analog source (e.g., 18) and generating a first residue (58) of the analog signal at an output (e.g., 32). The first circuit may be selectively configurable in a first mode for integrating the analog signal to generate an integrated analog signal and configurable in a second mode for disconnecting the first circuit from the analog source while folding the integrated analog signal to generate the first residue. The analog to digital conversion circuit also includes a second circuit (60) coupled to the output of the first circuit for resolving the first residue provided by the first circuit and for generating a further resolved second residue (98).

20 Claims, 4 Drawing Sheets

PIPELINE ANALOG TO DIGITAL CONVERTER

FIELD OF THE INVENTION

The present invention relates to an analog to digital conversion circuit, and, more particularly, to a charge to digital conversion circuit for converting an analog input signal into digital output bits.

BACKGROUND OF THE INVENTION

Conventional analog to digital conversion circuits may include charge to voltage converters that typically comprise an operational amplifier (op amp) with an integrating capacitor connected between an inverting terminal and an output terminal of the operational amplifier. A linear relationship exists between an input charge applied at an input of the op amp and an output voltage of the operational amplifier when the operational amplifier operates within a characteristic active region. Characteristically, the operational amplifier is able to hold a finite amount of charge before the operational amplifier saturates and begins to display a non-linear relationship between the input charge and the output voltage. In analog to digital conversion circuits, linear operation of the operational amplifier is desired to accurately resolve the analog input signal into digital output bits. To accommodate a large range of input charges, integrate and fold circuitry has been proposed to effectively increase a dynamic range of the analog to digital conversion circuit while ensuring that the op amp is operated in a linear region so that a desired conversion accuracy is achieved.

An example of an charge to digital analog to digital converter using integrate and fold circuitry with saturation prevention is described in U.S. Pat. No. 6,366,231. Such analog to digital converters typically include multiple stages to achieve a desired degree of resolution, with each stage amplifying a folding residue from a previous stage. Folding in a conventional first stage is typically suspended to allow an output of the first stage to settle before allowing a residue to be sampled by a second stage. It is desired to reduce the settling time of the first stage to achieve faster conversion, but solutions such as increasing a bandwidth of a first stage op amp or increasing an integrating capacitor size requires an undesirable increase in power requirements and circuit area, respectively.

In second stage of a converter, amplification of the residue from the first stage is typically performed by first amplifying the residue with a sampling capacitor at the input of the second stage to produce a charge amplified residue. The charge amplified residue is then amplified via a feedback capacitor of a stage amplifying op amp to produce a stage amplified residue. Folding in the second stage is then accomplished by discharging a sampling capacitor into to the smaller feedback capacitor using a current source. The second stage folding process is partially governed by an resistor-capacitor (RC) time constant of the second stage as the current source degenerates into a resistor at low current levels near an end of a discharging cycle. As a result, the RC time constant determines a conversion rate of the second stage. In addition, because of time limitation imposed for folding in the first stage, a residue provided to the second stage may be relatively large, requiring a relatively large number of folds, and a corresponding large amount of time for performing the required folds in the second stage. A fold rate of such a second stage is typically limited by a bandwidth of the second stage op amp. Increasing a bandwidth of the second stage op amp may improve performance, but at the cost of an undesirable increase in power requirements. In diagnostic imaging equipment, such as in digital x-ray or computed-tomography (CT) systems, it is desired to increase conversion speed while reducing power requirements and reducing circuit size.

DETAILED DESCRIPTION OF THE INVENTION

The inventor of the present invention has innovatively realized that by disconnecting a first stage of an integrate and fold analog to digital converter from its analog signal source and eliminating the need to suspend folding in the first stage of an conventional integrate and fold analog to digital converter, improved first stage analog to digital conversion can be achieved. In addition, the inventors have innovatively realized that by performing second stage folding before amplifying the residue for the first state, and by using higher resolution comparators than conventionally used to establish fold thresholds, improved second stage analog to digital conversion can be achieved.

Figure 1:
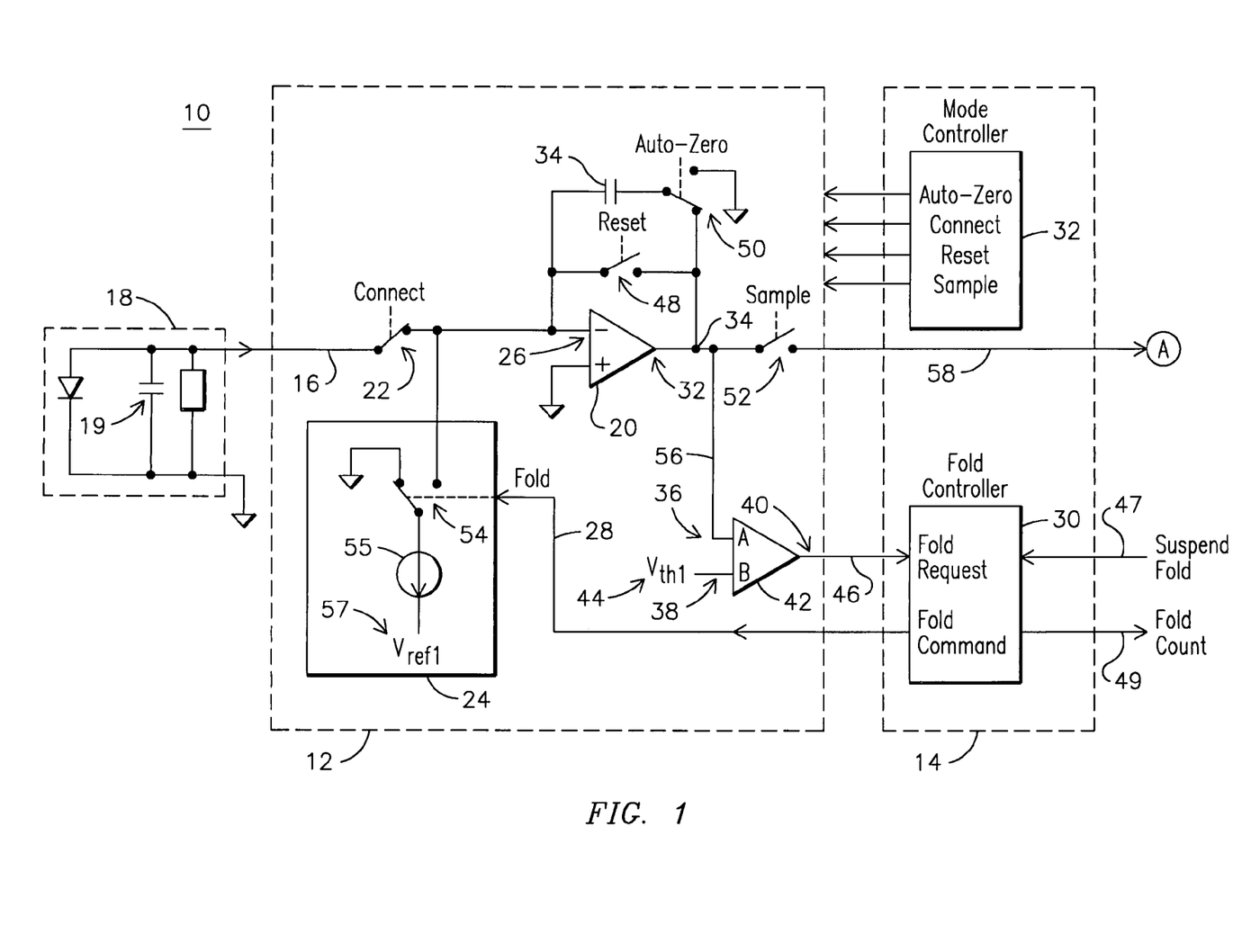
FIG. 1 is an example circuit diagram of a first stage of an analog to digital converter including improved integrate and fold circuitry.

FIG. 1 is an example circuit diagram of a first stage 10 of an analog to digital converter including improved integrate and fold circuitry. The first stage 10 may include a current processing circuit 12 and a first stage control circuit 14 for controlling an operation of the current processing circuit 12. In an embodiment, the first stage control circuit 14 may be embodied in a processor programmed to provide desired control signals for controlling operation of the current processing circuit 12.

An analog input 16 may be provided to the current processing circuit 12 by an analog source, such as a photodiode 18 responsive to excitations from an imaging system, for example, a digital x-ray and/or computer tomography (CT) system. In an embodiment, the current processing circuit 12 includes an amplifier, such as an operational amplifier (op-amp) 20, configurable, for example, in an integration configuration and a unity gain configuration. In an integration configuration, an integrating capacitor 34 may be connected between the inverting input 26 and the output 33. In a unitary gain configuration, the inverting input 26 may be directly connected to the output 33. The analog input 16 from the photodiode 18 may be selectively provided to the inverting input 26 of the op amp 20 by connect switch 22. Accordingly, the current processing circuit 12 may be selectively configured to store a charge proportional to an integral of the analog input signal 16.

Figure 5A:
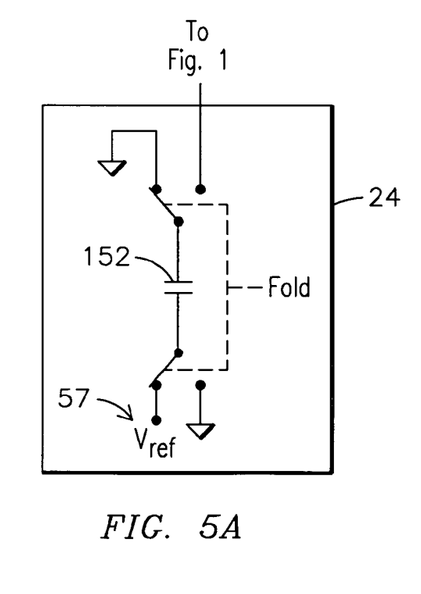
FIGS. 5A and 5B are example embodiments of a fold circuit including a switched capacitor.
Figure 5B:
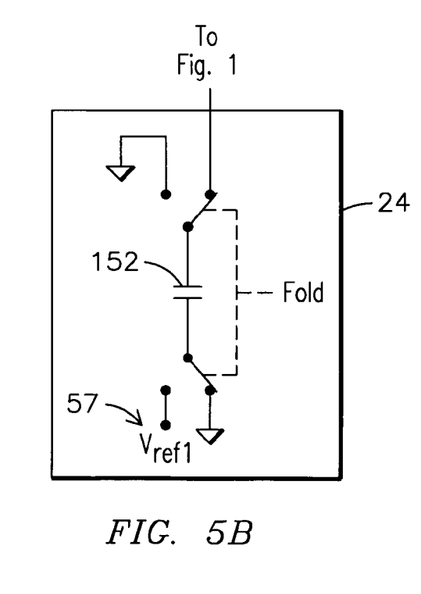

A charge subtracting, or folding circuit 24, may configured for selectively subtracting, for example, during a folding operation, a predetermined charge from the current processing circuit 12, such as from the inverting input 26 of the op amp 20. The folding circuit 24 may include a switched current source 55 or a switched voltage source for providing a charge subtracting current. The folding circuit 24 may be provided a reference voltage VREF1 57. In another embodiment depicted in FIGS. 5A and 5B, the folding circuit 24 may include a capacitor 152 that is charged via connection to the reference voltage 57 when not connected to the circuit 12 (FIG. 5A), and discharged when connected to the circuit 12 during folding, such as by switching the capacitor 152 from being connected to the voltage reference 57 to being connected to ground (FIG. 5B).

Returning to FIG. 1, the folding circuit 24 may be operated in response to a fold command signal 28 provided by a fold controller 30 of the first stage control circuit 14. To determine when a charge on the circuit 12 has reached a predetermined level requiring charge subtraction, or folding, the current processing circuit 12 may include a comparator 42 having a first input 36 connected to the output 33 of the op amp 20 and an second input 38 connected to a voltage reference, Vth1 44 providing a desired voltage reference value for comparison with a voltage present at the first input 36. In an embodiment, the comparator 42 is configured to provide a fold request signal 46 to the fold controller 30, for example, when the voltage present at the first input 36 exceeds the voltage of the voltage reference Vth1 44. Upon receiving the fold request signal 46, the fold controller 30 may issue a fold command 28 to the current processing circuit 12. The fold controller 30 may also operate in response to a suspend fold command 47 and may provide a fold count 49 to tally a number of charge subtraction, or folding, operations performed by the circuit 12. This number may be used to determine most significant bits of a converted signal.

In a first step of performing an analog to digital conversion of the analog input signal 16, the current processing circuit 12 may be operated in an integrate mode, and then operated in a folding mode to provide a first analog residue 58 responsive to the analog input signal 16. The current processing circuit 12 may be selectively configured, for example, by the mode controller 32, to perform desired integrate and fold operations. The mode controller 32 may control operation of switches in the current processing circuit 12 to configure the circuit 12 in a desired operating mode. The mode controller 32 may operate in conjunction with the fold controller 30 to configure the circuit 12 for a folding operation. In an aspect of the invention, the mode controller 32 may control operation of an auto-zero switch 50, a connect switch 22, a reset switch 48 and a sample switch 52. The fold controller 30 may control operation of a fold switch 54. The mode controller 32 and the fold controller 30 may selectively configure the switches 50, 22, 48, 52, 54 to provide various modes of operation as described below.

In a reset mode, the switches 50, 22, 48, 52, 54 may be configured, for example, by the mode controller 32 and fold controller 30 as shown in Table 1 below:

TABLE 1

Reset Mode Switch Configuration

| Switch | Switch Setting |
| --- | --- |
| Connect (22) | Open |
| Auto Zero (50) | Ground or AZ Reference Voltage |

TABLE 1-continued

Reset Mode Switch Configuration

| Switch | Switch Setting |
| --- | --- |
| Reset (48) | Closed |
| Sample (52) | Open |
| Fold (54) | Ground |

According to the reset mode switch settings in Table 1, circuit 12 is disconnected from the photodiode 18 by the connect switch 22 being open. The circuit 12 may also be disconnected from downstream circuit stages by sample switch 52 being open. Reset switch 48 being closed configures the op amp 20 in a unity gain configuration. Integrating capacitor 34 is shunted to ground by auto zero switch 50. Charge subtraction from the inverting input 26 of the op amp 20, or folding, is disabled by grounding of fold switch 54.

In an integration mode with no folding, the switches 50, 22, 48, 52, 54 may be configured as shown in Table 2:

TABLE 2

Integrate Mode, No Folding Switch Configuration

| Switch | Switch Setting |
| --- | --- |
| Connect (22) | Closed |
| Auto Zero (50) | Closed |
| Reset (48) | Open |
| Sample (52) | Open |
| Fold (54) | Ground |

The circuit 12 may be initially configured in an integration mode with no folding, for example, when a signal from the photodiode 18 is to be integrated. According to the switch setting in Table 2, circuit 12 is connected to the input diode 18 by the connect switch 22 and disconnected from downstream circuit stages by sample switch 52 being open. In an aspect of the invention, downstream circuit stages may be processing a prior residue signal from the first stage while the first stage is integrated a new signal. Reset switch 48 is open and auto zero switch is closed to configure the op amp 20 in an integrating configuration. As a result, the analog input signal 16 is integrated by the op amp 20 to generate an integrated analog signal 56 route to the comparator 42. In this mode, folding is disabled by grounding of fold switch 54. As the integrated analog signal 16 reaches a level at which folding is desired, the circuit 12 may be transitioned from an integration mode to a folding mode by controlling the switches to the setting shown in Table 3:

TABLE 3

Folding Mode Configuration

| Switch | Switch Setting |
| --- | --- |
| Connect (22) | Open |
| Auto Zero (50) | Closed |
| Reset (48) | Open |
| Sample (52) | Open |
| Fold (54) | Closed |

The circuit 12 may be configured in a folding mode, for example, when a value of the integrated analog signal 56 routed to the comparator 42 exceeds a predetermined threshold value, such as the value of the voltage reference Vth1 44, thereby indicating a need to initiate folding. Unlike conventional integrate and fold circuits, the circuit 12 may be disconnected from an input source, such as the photodiode 18, advantageously allowing the first stage 10 to operate at a higher conversion speed than conventional integrate and fold circuits that typically remain connected to an input source. This higher conversion speed may be achieved because a shunt capacitance 19 comprising, for example, a photodiode capacitance, routing capacitance, and packaging capacitance, is disconnected from the circuit 12, thereby greatly decreasing the settling time of the circuit 12. The signal 16 from the photodiode 18 is preserved since it is stored on the shunt capacitance 19 during folding. According to the switch setting in Table 3, circuit 12 is disconnected from the photodiode 18 by opening the connect switch 22. Fold switch 54 is closed to subtract a predetermined charge from the inverting input 26 of the op amp 20. The circuit 12 remains disconnected from downstream circuit stages by sample switch 52 remaining open. Reset switch 48 remains open and auto zero switch 50 is closed, leaving the op amp 20 configured in an integrating configuration.

After a predetermined charge is subtracted from the circuit 12, the circuit 12 may be reconfigured in the integration mode according to Table 2 to continue integrating the integrated analog signal 56 routed to the comparator 42 exceeds a predetermined threshold value routed to the comparator 42 again reaches a predetermined threshold value. Upon the integrated analog signal 56 exceeding the predetermined threshold value, the circuit 12 is reconfigured in the fold mode to subtract the charge. The circuit 12 may be cyclically configured in the integrate mode and fold modes until an end of a conversion cycle. A conversion cycle may be defined as a time allocated to for converting the signal 16 from the photodiode 18 to a digital number. Each conversion cycle, the analog to digital converter provides a digital number proportional to the signal received during that time. In an embodiment, the integrate and fold cycle may repeated a sufficient amount of times to provide a desired analog residual signal value. In another embodiment, the number of integrate and fold cycles may be limited by a certain time period allotted for performing integration and folding.

After a desired number of fold cycles have been completed, the circuit 12 may be configured in a fold completion mode. In the fold completion mode, the switches may be configured as shown in Table 4:

TABLE 4

Fold Completion Mode Switch Configuration

| Switch | Switch Setting |
|---|---|
| Connect (22) | Open |
| Auto Zero (50) | Closed |
| Reset (48) | Open |
| Sample (52) | Closed |
| Fold (54) | Ground |

According to the switch settings in Table 4, circuit 12 is again disconnected from the input diode 18 by opening the connect switch 22. Reset switch 48 remains open, and auto zero switch 50 is closed, leaving the op amp 20 configured in an unity gain configuration with the feedback capacitor 34 holding the residue. The first analog residue 58 present at the output 33 of the op amp 20 may then be provided to a downstream circuit stage by sample switch 52 being closed.

Figure 2:
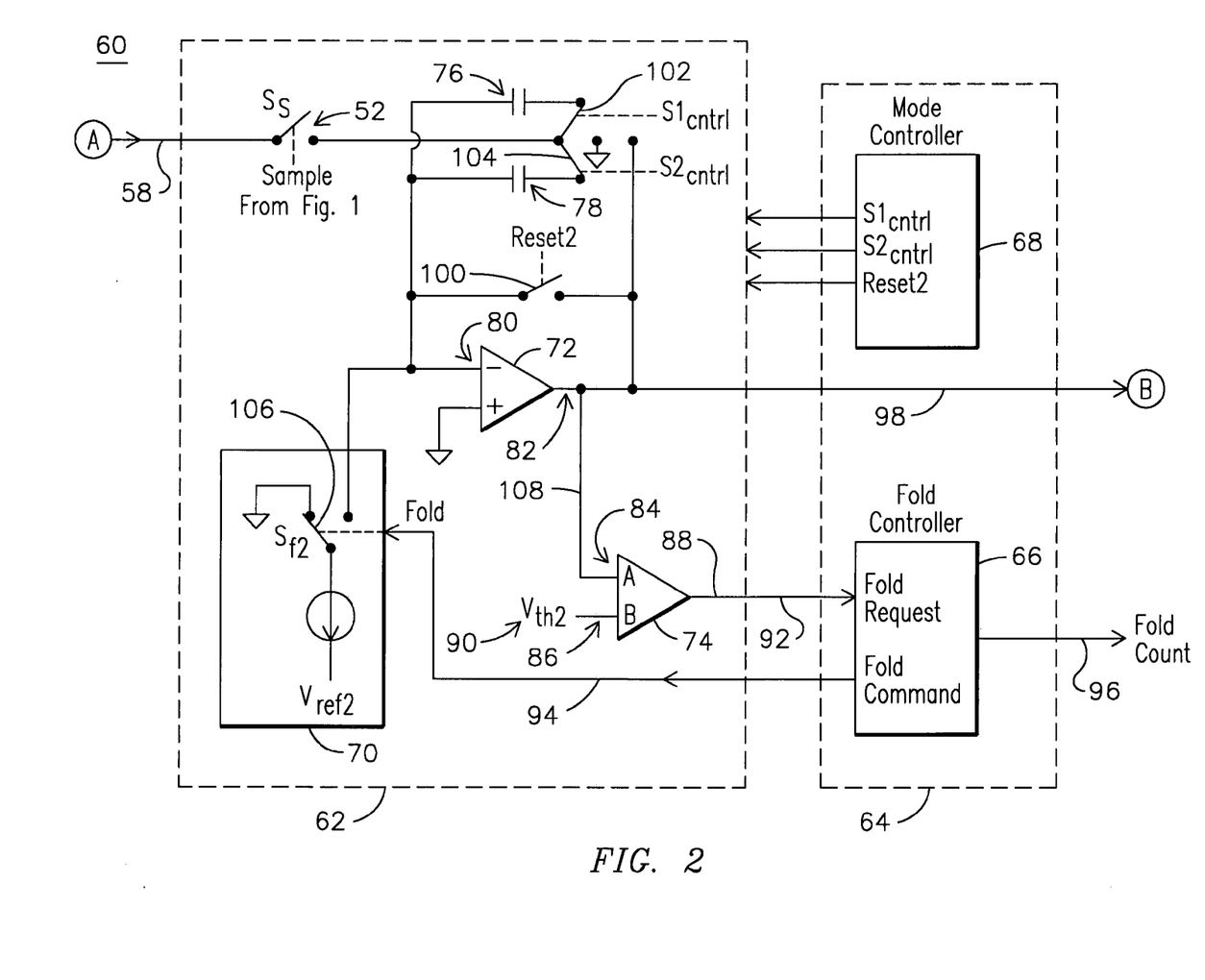
FIG. 2 is an example circuit diagram of a second stage of an analog to digital converter including improved integrate and fold circuitry optimized for pipeline conversion.

The first analog residue 58 provided by the first stage 10 may be further resolved by a downstream stage, or pipeline stage, such as the second stage 60 shown in FIG. 2. The second stage 60 may include a voltage processing circuit 62 and a second stage control circuit 64 for controlling an operation of the voltage processing circuit 62. In an embodiment, the second stage control circuit 64 may be embodied in a processor programmed to provide desired control signals for controlling operation of the voltage processing circuit 62. In another embodiment, the second stage control circuit 64 may be combined with the first stage control circuit 14 and may be embodied in the same processor as the first stage control circuit 14.

The voltage processing circuit 62, may include an op-amp 72 configurable, for example, in a charging configuration, an integration configuration, and a unity gain configuration. In a charging configuration, a capacitor, such as a parallel combination of capacitors 76, 78 may be selectively connected between the first stage 10 and the inverting input 80 of the op amp 72 to allow the first analog residue 58 to charge the parallel combination of capacitors 76, 78. In an integration configuration, an integrating capacitor, such as one, or both, capacitors 76, 78 of the parallel combination of the capacitors 76, 78 may be selectively connected between the inverting input 80 and the output 82 of the op amp 72. In a unitary gain configuration, the inverting input 80 may be directly connected to the output 82.

The voltage processing circuit 62 may also include a charge subtracting, or folding circuit 70, configured for selectively subtracting a predetermined charge from the circuit 62, such as from the inverting input 80 of the op amp 72, during a folding operation. A comparator 74 having a first input 84 connected to the output 82 of the op amp 72, and an second input 86 connected to a voltage reference Vth2 90, may be configured for sensing a need to perform a folding operation. In an embodiment, the voltage reference Vth2 90 may be varied to provide different sized folds. For example, a voltage of the voltage reference Vth2 90 may be controlled to have the about the same value as the voltage reference source Vth1 44 of the first stage 10 to perform a similar-sized fold. In another embodiment, the voltage reference Vth2 90 may be controlled to have a reduced value compared to the first stage to perform a relatively smaller sized fold.

The comparator 74 may provide a fold request signal 92 to the fold controller 66 when the voltage at the first input 84 exceeds a reference voltage of the voltage reference Vth2 90. Upon receiving the fold request signal 46, the fold controller 66 may issue a fold command 94 to the voltage processing circuit 60. The fold controller 66 may also provide a fold count 96 to tally a number of charge subtraction, or folding operations, performed by the circuit 62. This number may be used to determine additional bits of a converted signal.

The voltage processing circuit 62 may be configurable for operating in a charge amplification mode, followed by a folding mode, and then a stage amplification mode to resolve the analog residue into a second analog residue 98 provided at an output 82 of the op amp 72. The voltage processing circuit 60 may be selectively configured, for example, by the mode controller 68, to perform charge amplification, folding, and then stage amplification operations. The mode controller 68 may control operation of switches in the voltage processing circuit 60 to configure the circuit 60 in a desired operating mode, and may operate in conjunction with the fold controller 66 to configure the voltage processing circuit 60 for a folding operation. In an aspect of the invention, the mode controller 68 may control operation of a reset switch 48, a first capacitor switch 102, and a second capacitor switch 104. The fold controller 66 may control operation of a fold switch 54. The mode controller 68 and the fold controller 66 may selectively configure the switches 48, 54, 102, 104 to provide various modes of operation as described below. In an embodiment of the invention, a charge amplification mode may comprise a sample phase followed by a hold phase.

In the sample phase of the charge amplification mode, the switches may be configured, for example, by mode controller 32 (See FIG. 1), mode controller 68, and fold controller 66 as shown in Table 5:

TABLE 5

Sample Phase Switch Configuration

| Switch | Switch Setting |
| --- | --- |
| Sample (52) | Closed |
| First Capacitor (102) | Connect first capacitor (76) to inverting input (80) of op amp (72) |
| Second Capacitor (104) | Connect second capacitor (78) to inverting input (80) of op amp (72) |
| Reset (100) | Closed |
| Fold (106) | Ground |

According to the switch setting in Table 5, the circuit 60 may be configured to sample the first analog residue 58 by closing sample switch 52 to connect the second stage 60 to the first stage 10. First and second capacitors 76, 78 are connected to the input 80 of the op amp 72 via respective switches 102, 104 so that the capacitors 76, 78 become charged by the first analog residue 58. Reset switch 48 being closed configures the op amp 20 in a unity gain configuration. Charge subtraction from the inverting input 80 of the op amp 72, or folding, is disabled by grounding of fold switch 106.

In a hold phase of the charge amplification mode, the switches may be configured, for example, by mode controller 32 (See FIG. 1), mode controller 68, and fold controller 66 as shown in Table 6:

TABLE 6

Sample Hold Phase Switch Configuration

| Switch | Switch Setting |
| --- | --- |
| Sample (52) | Open |
| First Capacitor (102) | Connect first capacitor (76) to output (82) of op amp (72) |
| Second Capacitor (104) | Connect second capacitor (78) to output (82) of op amp (72) |
| Reset (100) | Open |
| Fold (106) | Ground |

According to the switch setting in Table 6, the circuit 60 may be configured to hold the charge applied to capacitors 76, 78. The capacitors, previously being configured to be wired in parallel to the input 80 of the op amp 72, are wired in parallel in a feedback path between the input 80 and output 82 of the op amp 72 by connection of switches 102 and 104 respectively to the output 82 of op amp 72 while the sample switch 52 is opened to disconnect the second stage 60 from the first stage 10. Reset switch 48 being open configures the op amp 20 in a hold configuration. Charge subtraction from the inverting input 80 of the op amp 72, or folding, is disabled by grounding of fold switch 106.

After holding the charge applied to the capacitors 76, 78, the circuit 60 may be configured for folding. Unlike conventional pipeline stage techniques, folding may be performed prior to amplifying the first analog residue 58, advantageously reducing a bandwidth requirement compared to conventional techniques. The bandwidth requirement may be reduced in this configuration because both capacitors 76, 78 are configured in feedback, and no capacitors are connected between the inverting input 80 and ground, so that the op amp 72 is configured in unity gain feedback, thereby ensuring maximum bandwidth. As is understood in the art, if gain of an op amp is unity, then the bandwidth of the op amp is at a maximum.

In a fold mode, the switches may be configured, for example, by mode controller 32 (See FIG. 1), mode controller 68, and fold controller 66 as shown in Table 7:

TABLE 7

Folding Switch Configuration

| Switch | Switch Setting |
| --- | --- |
| Sample (52) | Open |
| First Capacitor (102) | Connect first capacitor (76) to output (82) of op amp (72) |
| Second Capacitor (104) | Connect second capacitor (78) to output (82) of op amp (72) |
| Reset (100) | Open |
| Fold (106) | Connect to inverting input (80) of op amp (72) |

According to the switch setting in Table 7, the circuit 62 may be configured in a folding mode, for example, when a value of an integrated output signal 108 routed to the comparator 74 exceeds a predetermined threshold value, such as the value of the voltage reference Vth2 90, indicating a need to initiate folding. In an embodiment, a radio of the value of the voltage reference Vth1 44 of the first stage 10 and a value of the voltage reference Vth2 90 of the second stage 60 may be selected to be equivalent to a ratio of a capacitance value of capacitor 76 and a capacitance value of capacitor 78. In another embodiment, the value of the voltage reference Vth1 44 of the first stage 10 may be greater than a value of the voltage reference Vth2 90 of the second stage 60.

According to the switch setting in Table 7, fold switch 106 is closed to subtract a predetermined charge from the inverting input 80 of the op amp 72. Switches 102 and 104, respectively, are connect to the output 82 of the op amp 72 to connect the capacitors 76, 78 in feedback, while reset switch 100 remains open.

After a predetermined charge is subtracted from the circuit 62, the circuit 62 may be reconfigured in the hold mode according to Table 6 to allow a voltage at the output 82 of the op amp 72 to settle prior to further folding. The circuit 62 may then be reconfigured in the fold mode according to Table 7 to subtract the charge. The circuit 62 may be cyclically configured in the hold mode and fold mode until the output 108 has been reduced to a desired second analog residue 98.

In an aspect of the invention, the second stage 10 may receive a first analog residue 58 that exceeds a certain fold threshold, such as a voltage of voltage reference, Vth1 44. Consequently, the circuit 62 may be configured for folding at the threshold of the first stage 10, such as by providing the same value of the voltage reference vth2 90 as the value of the first stage voltage reference Vth1 44. If a first analog residue 58 is below a fold threshold of the first stage 10, the second stage 60 may be configured for performing folding at a reduced threshold, such as about 10% of the first stage threshold, by providing a second stage voltage reference vth2 90 being about $\frac{1}{10}$th the value of the first stage voltage reference Vth1 44.

After a desired number of fold cycles has been completed, the circuit 62 may be configured in a stage amplification mode. In the stage amplification mode, the switches of the circuit 62 may be configured as shown in Table 8:

TABLE 8

Stage Amplification Switch Configuration

| Switch | Switch Setting |
| --- | --- |
| Sample (52) | Open |
| First Capacitor (102) | Connect first capacitor (76) to ground |
| Second Capacitor (104) | Connect second capacitor (78) to output (82) of op amp (72) |
| Reset (100) | Open |
| Fold (106) | Connect to ground |

According to the switch settings in Table 8, capacitor 76 is connected to ground by switch 102 and capacitor 78 remains connected in feedback by switch 104. Accordingly, a charge remaining on capacitor 76 is discharged into capacitor 78, resulting in voltage amplification and generation of a second analog residue 98 that may be provided to a downstream circuit for further amplification. In an embodiment of the invention, a capacitance of capacitor 76 may be greater than a capacitance of capacitor 78. Reset switch 48 remains open and folding is disabled by grounding of fold switch 106. After stage amplification, and passing on the second analog residue 98 to a downstream stage, if present, the circuit 62 may be reconfigured according to Table 6 in preparation for receiving a different first analog residue 58.

Figure 3:
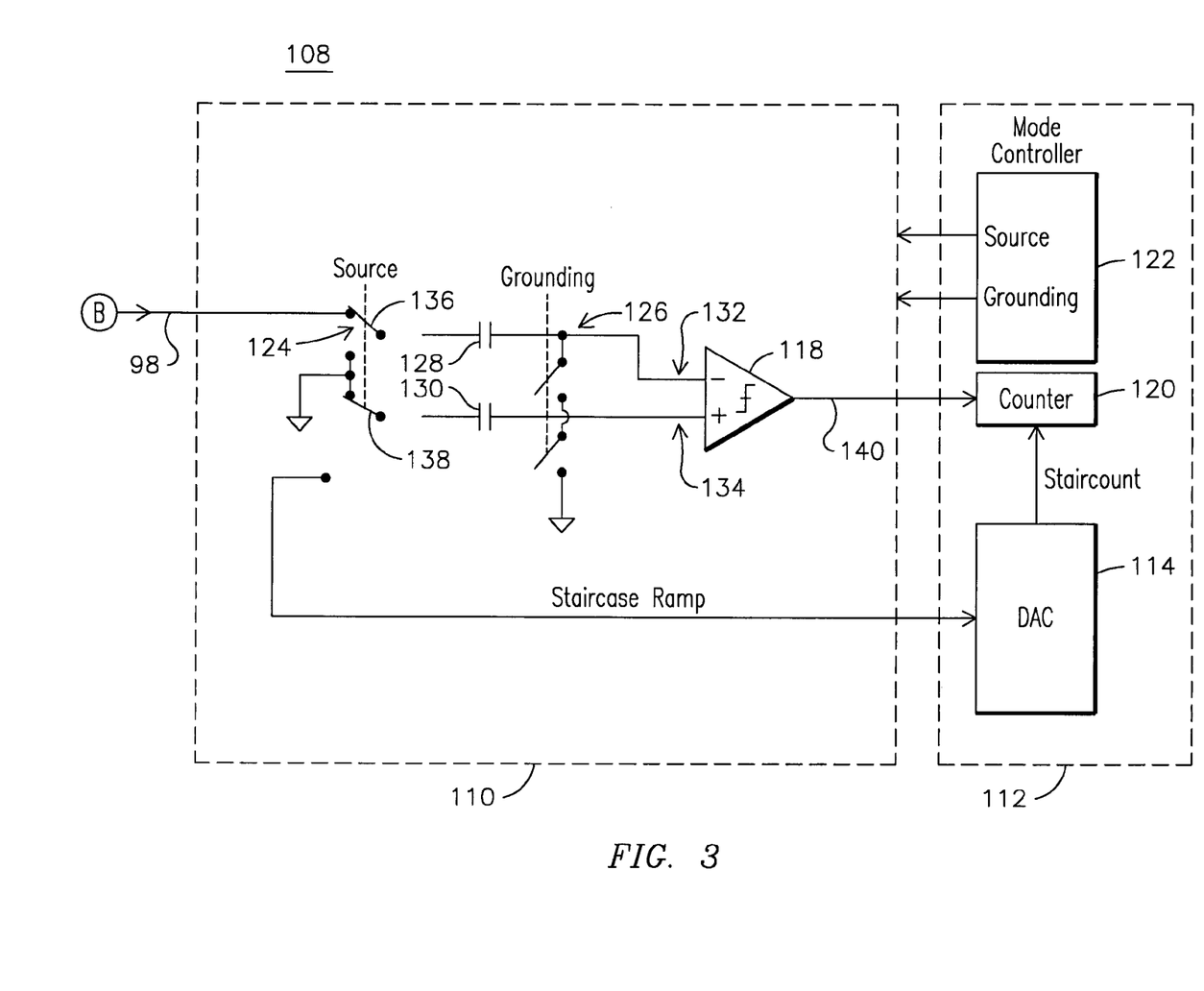
FIG. 3 is an example circuit diagram of a final stage of an analog to digital converter.

The second analog residue 98 may be further resolved in third stage, such as the final stage circuit 108 shown in FIG. 3. The final stage circuit 108 may include a charge processing circuit 110 and a final stage control circuit 112 for controlling an operation of the charge processing circuit 110. In an embodiment, the final stage control circuit 112, or portions thereof, may be embodied in a processor programmed to provide desired control signals for controlling operation of the charge processing circuit 110. In another embodiment, the final stage control circuit 112 may be combined with the first stage control circuit 14 and second stage control circuit 64, and may be embodied in the same processor as used for first and second stage control.

The final stage circuit 108 further reduces the residual signal 98 by comparing the second analog residue 98 with a varying voltage signal, such as a staircase ramp signal 116 that may be provided by a digital to analog converter (DAC) 114. A comparator 118 compares the second analog residue 98 to the staircase ramp 116 and latches a counter 120 counting the a number of staircase steps provided by the DAC 114, for example, when the a staircase step value exceeds the second analog residue 98. Accordingly, the value latched by the counter 120 represents a digital representation of the second analog residue 98.

The charge processing circuit 110 may be configurable for operating in a sampling mode to sample the residual signal, followed by a comparison mode to compare the sampled residual signal to a staircase ramp. The charge processing circuit 110 may be selectively configured, for example, by the mode controller 122, to perform sampling and comparison operations.

The mode controller 122 may control operation of switches in the voltage processing circuit 110 to configure the circuit 110 in a desired operating mode. In an aspect of the invention, the mode controller 122 may control operation of a source switch 124 and a grounding switch 126. In aspect of the invention, the switches may be double pole, single throw type switches as shown. The mode controller 122 may selectively configure the switches to provide various modes of operation as described below. In the sample mode, the switches may be configured, for example, by mode controller 122 as shown in Table 9:

TABLE 9

Sample Mode Switch Configuration

| Switch | Switch Setting |
| --- | --- |
| Source (124) | Connect to residual (98) |
| Grounding (126) | Closed |

According to the switch setting in Table 9, the circuit 110 may be configured to sample the second analog residue 98 by connecting a first pole 136 of sample switch 52 to connect the final stage 108 to the second stage 60 of FIG. 2. The second analog residue 98 may then be conducted across sampling capacitor 128 to a first input 132 of the comparator 118 and to ground by closing grounding switch 126. Accordingly, the second analog residue 98 is sampled by capacitor 128. A second pole 138 of source switch 124 is connected to ground while the first pole 136 is connected to the second stage 60.

In the compare mode implemented following the sample mode, the switches of the circuit 110 may be configured, for example, by mode controller 122 as shown in Table 10:

TABLE 10

Compare Mode Switch Configuration

| Switch | Switch Setting |
| --- | --- |
| Source (124) | Connect to staircase ramp (116) |
| Grounding (126) | Open |

According to the switch setting in Table 10, the circuit 110 may be configured to compare the sampled residual 98 to the staircase ramp 116 by connecting the second pole 138 of sample switch 124 to the staircase ramp 116, so that the staircase ramp 116 is provided to a second input 134 of the comparator 118 through capacitor 130. In this switch position, the first pole 136 is connected to ground. The grounding switch 126 is opened so that charges on respective capacitors 128, 130 can be read and compared by comparator 118 until a staircase ramp step exceeds the second analog residue 98. Upon detecting this condition, the comparator 118 provides a counter latch signal 140 to latch the counter 120 at a ramp count value indicative of the second analog residue 98.

In another aspect of the invention, the stages 10, 60, 108 may be combined in different pipeline configurations to provide a desired level of resolution. For example, the output of the first stage 10 may be directly connected to the final stage 108. In another embodiment, one or more one second stages 60 may be serially connected, or pipelined, between the first 10 and final stages 108.

Figure 4:
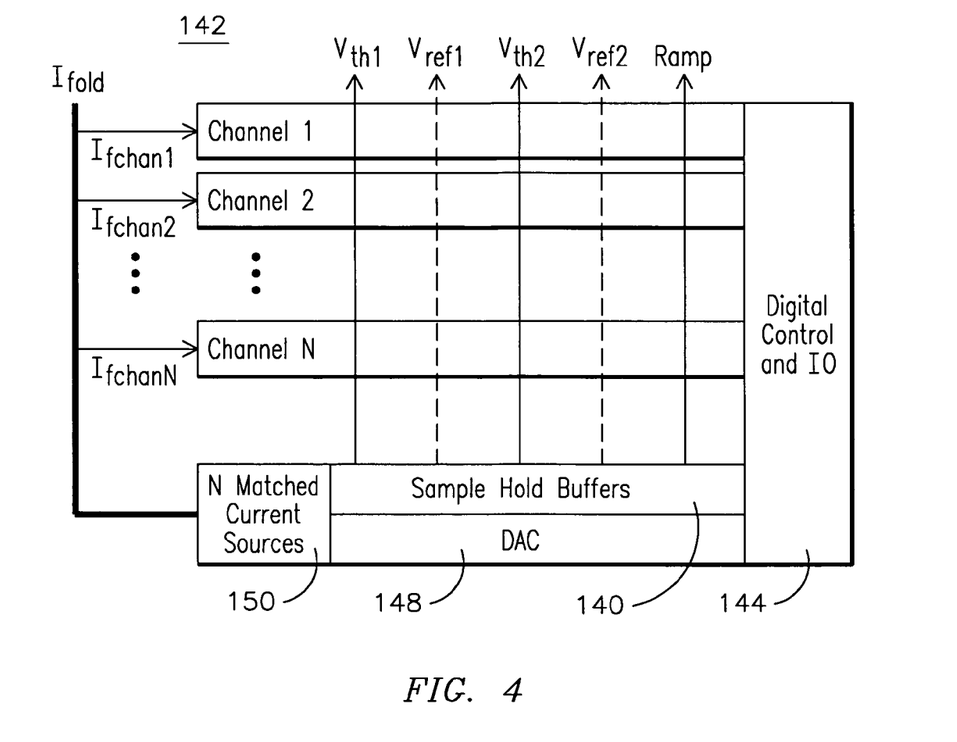
FIG. 4 is an example multi-channel configuration for an analog to digital converter that may include circuitry illustrated in FIGS. 1, 2, and 3.

In yet another embodiment of the invention, the stages 10, 60, 108 described above may be used in a multi channel configuration as shown in FIG. 4. The control circuits 14, 64, 112 for the stages used in each channel 150 may be incorporated in a digital and input/output (I/O) controller 144.

Respective reference voltages Vth1 44 and Vth2 90 and respective staircase ramps 116 may be provided to each of the stages of each channel by a global DAC 148, for example, via a sample and hold buffer 146. The current or voltage references for the fold circuits 24, 70 of each stage of each channel may be globally provided by channel matched current sources 150. In an optional embodiment, reference voltages Vref1 and Vref2 (indicated by dotted lines), for switched capacitor current subtracting embodiments of the fold circuits 24, 70 may be provided to each of the stages of each channel by a global DAC 148 via the sample and hold buffer 146.

While various embodiments of the present invention have been shown and described herein, such embodiments are provided by way of example only. Numerous variations, changes and substitutions will occur to those of skill in the art without departing from the invention herein. Accordingly, it is intended that the invention be limited only by the spirit and scope of the appended claims.

I claim:

1. An analog to digital conversion circuit comprising:
a first circuit for receiving an analog signal applied to an input of the first circuit via a connection to an analog source and generating a first residue of the analog signal at an output, the first circuit selectively configurable in a first mode for integrating the analog signal to generate an integrated analog signal and configurable in a second mode for disconnecting the first circuit from the analog source while folding the integrated analog signal to generate the first residue; and
a second circuit coupled to the output of the first circuit for resolving the first residue provided by the first circuit and for generating a further resolved second residue.

2. The conversion circuit of claim 1, comprising a third circuit coupled to an output of the second circuit for further resolving the second residue.

3. The conversion circuit of claim 1, the first circuit further comprising a switch for selectively connecting the first circuit to the analog source.

4. The conversion circuit of claim 3, further comprising a controller controlling an operation of the switch to connect the first circuit to the analog source during the first mode of operation and to disconnect the first circuit from the analog source during the second mode of operation.

5. The conversion circuit of claim 1, wherein the first circuit comprises a comparator having a first input receiving the first residue.

6. The conversion circuit of claim 5, wherein a second input of the comparator is coupled to a voltage reference for comparison to the first residue present at the first input.

7. An analog to digital conversion circuit comprising:
a first circuit for receiving an analog signal and generating a first residue of the analog signal at an output; and
a second circuit coupled to the output of the first circuit for receiving the first residue and generating a second residue, the second circuit selectively configurable in a first mode for folding the first residue to generate a folded first residue and configurable in a second mode after folding the first residue for amplifying the folded first residue to generate the second residue at an output of the second circuit.

8. The conversion circuit of claim 7, wherein the second circuit comprises an amplifier having a first capacitor and a second capacitor connected in parallel between an input of the amplifier and an output of the amplifier when the second circuit is configured in the first mode.

9. The conversion circuit of claim 8, wherein the first capacitor is shunted to ground when the second circuit is configured in the second mode.

10. The conversion circuit of claim 9, wherein the first capacitor has a capacitance value greater that a capacitance value of the second capacitor.

11. The conversion circuit of claim 7, the second circuit being selectively configurable in a third mode for amplifying the first residue before folding the first residue in the first mode.

12. The conversion circuit of claim 11, wherein the second circuit comprises an amplifier having a pair of capacitors connected in parallel between the output of the first circuit and an input of the amplifier when the second circuit is configured in the third mode.

13. The conversion circuit of claim 12, wherein the amplifier is configured for unity gain when the second circuit is configured in the third mode.

14. The conversion circuit of claim 7, wherein the second circuit is further configurable in the first mode for performing variable sized folds.

15. The conversion circuit of claim 7, further comprising a third circuit coupled to the output of the second circuit for further resolving the second residue.

16. An analog to digital conversion circuit comprising:
a first circuit for receiving an analog signal applied to an input of the first circuit via a connection to an analog source and generating a first residue of the analog signal at an output, the first circuit selectively configurable in a first mode for integrating the analog signal to generate an integrated analog signal and configurable in a second mode for disconnecting the first circuit from the analog source while folding the integrated analog signal to generate the first residue; and
a second circuit coupled to the output of the first circuit for receiving the first residue and generating a second residue, the second circuit selectively configurable in a first mode for folding the first residue to generate a folded first residue and configurable in a second mode after folding the first residue for amplifying the folded first residue to generate a second residue at an output of the second circuit.

17. The conversion circuit of claim 16, further comprising a third circuit having an input coupled to the output of the second circuit for further resolving the second residue.

18. A method for performing analog to digital conversion in a conversion circuit comprising a first stage configurable in an integration mode for integrating an analog signal and configurable in a folding mode for folding an integrated analog signal to generate a residue responsive to the analog signal, the method comprising:
connecting the integrate and fold circuit to an analog signal source providing an analog signal to be converted during an integration mode; and
disconnecting the integrate and fold circuit from the analog source during a folding mode.

19. The method of claim 18, wherein the conversion circuit further comprises a second stage for further processing the residue, the method comprising:
folding the first residue to generate a folded first residue; and
after folding the first residue, amplifying the folded first residue to generate a second residue.

20. The method of claim 19, further comprising amplifying the first residue before folding.

* * * * *